United States Patent
Suzuki et al.

(10) Patent No.: US 10,234,489 B2
(45) Date of Patent: Mar. 19, 2019

(54) METHOD FOR MANAGING ASSEMBLING PROCESS OF ELECTRICAL PRODUCT

(71) Applicant: TOSHIBA MITSUBISHI-ELECTRIC INDUSTRIAL SYSTEMS CORPORATION, Chuo-ku (JP)

(72) Inventors: Norihiro Suzuki, Tokyo (JP); Shigehiko Matsuda, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 108 days.

(21) Appl. No.: 15/512,634

(22) PCT Filed: Sep. 24, 2014

(86) PCT No.: PCT/JP2014/075264
§ 371 (c)(1),
(2) Date: Mar. 20, 2017

(87) PCT Pub. No.: WO2016/046917
PCT Pub. Date: Mar. 31, 2016

(65) Prior Publication Data
US 2017/0292978 A1    Oct. 12, 2017

(51) Int. Cl.
*G01R 19/165*  (2006.01)
*G05B 19/418*  (2006.01)
*H05K 3/30*    (2006.01)
*G01R 1/36*    (2006.01)
*H05K 13/08*   (2006.01)
*G01R 31/28*   (2006.01)
*H05K 1/02*    (2006.01)

(52) U.S. Cl.
CPC ............ *G01R 19/165* (2013.01); *G01R 1/36* (2013.01); *G01R 19/16561* (2013.01);
(Continued)

(58) Field of Classification Search
CPC .......... G01R 1/36; G01R 27/16; G01R 27/18; G01R 19/165; G01R 19/16561;
(Continued)

(56) References Cited

U.S. PATENT DOCUMENTS 4,649,374 A    3/1987  Hoigaard
4,859,992 A    8/1989  Hoigaard
(Continued)

FOREIGN PATENT DOCUMENTS

CN    101957424 A    1/2011
JP    3-68875 A      3/1991
(Continued)

OTHER PUBLICATIONS

Combined Office Action and Search Report dated Aug. 1, 2018 in Chinese Patent Application No. 201480082191.9, (with English translation of Office Action and English translation of categories of cited documents), 16 pages.
(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

A method for managing an assembling process of an electrical product. The electrical product at least includes a substrate with a semiconductor component mounted thereon and a power supply circuit. In the method, during assembly of the electrical product, a potential difference between two points on electric wires or signal wires electrically connected with an impedance element, which is inside the electrical product, interposed therebetween is constantly measured. Also, in the method, if a change that exceeds a predetermined threshold value, based on which electrostatic discharge noise and a normal potential range are distinguished from each other, occurs in the potential difference between the two points, measurement data on the potential difference between the two points is recorded and a mark for indicating that the electrical product was affected by electrostatic discharge is provided to the electrical product.

7 Claims, 12 Drawing Sheets

(52) U.S. Cl.
CPC ..... *G01R 19/16576* (2013.01); *G05B 19/418* (2013.01); *H05K 3/303* (2013.01); *G01R 31/2806* (2013.01); *G05B 2219/45031* (2013.01); *H05K 1/0268* (2013.01); *H05K 13/08* (2013.01); *H05K 2203/163* (2013.01); *Y02P 90/02* (2015.11); *Y02P 90/04* (2015.11)

(58) Field of Classification Search
CPC ............ G01R 19/16576; G01R 31/001; G01R 31/002; G01R 31/2806; G05B 2219/5031; H05K 1/0254; H05K 1/0268; H05K 3/303; H05K 9/0067; H05K 13/08; H05K 13/082; H05K 2203/163
See application file for complete search history.

(56) References Cited

U.S. PATENT DOCUMENTS

| | | | |
|---|---|---|---|
| 5,057,965 A | 10/1991 | Wilson | |
| 7,038,279 B2* | 5/2006 | Kraz | G01R 31/18 |
| | | | 257/355 |
| 8,238,068 B2* | 8/2012 | Shannon | G01R 31/002 |
| | | | 361/56 |
| 2007/0095798 A1 | 5/2007 | Kraz | |

FOREIGN PATENT DOCUMENTS

| | | |
|---|---|---|
| JP | 10-12691 A | 1/1998 |
| JP | 2000-214192 A | 8/2000 |
| JP | 2002-190436 A | 7/2002 |
| JP | 2009-515171 A | 4/2009 |
| JP | 2009-135283 A | 6/2009 |
| JP | 2013-195154 A | 9/2013 |
| TW | 494243 | 7/2002 |
| TW | I403740 B | 8/2013 |

OTHER PUBLICATIONS

International Search Report dated Jan. 6, 2015 in PCT/JP2014/075264 filed Sep. 24, 2014.
Taiwanese Office Action dated Dec. 15, 2015 in TW 104104353 (with Partial English Translation).
Office Action dated Jun. 5, 2018 in Korean Patent Application n No. 10-2017-7004953 with unedited computer generated English translation, 9 pages.

* cited by examiner

METHOD FOR MANAGING ASSEMBLING PROCESS OF ELECTRICAL PRODUCT

FIELD

The present invention relates to a method for managing an assembling process of an electrical product.

BACKGROUND

In order to prevent work with a charged tool or human hands when assembling an electrical product in which a substrate including a semiconductor component (semiconductor device) (such as an IC, an LSI and a transistor), a storage apparatus, or the like, are combined, clothes or the like which remove and prevent static electricity is used. However, during assembly, an electrical product does not always have the same potential as that of the tool or a person, and there is a possibility that static electricity is accidentally discharged. The following literatures describe detection of static electricity discharge.

JP 10-12691 A discloses a technique of detecting an electromagnetic wave or discharge light of static electricity discharge due to a peeling charge generated on a substrate and detecting damage related to the static electricity discharge during manufacturing process of an electronic device (for example, a thin-film transistor liquid crystal display).

JP 2009-515171 A discloses a technique of using a voltage measuring circuit connected between a ground and a circuit substrate via a resistance to measure discharge of static electricity generated when an assembling tool is brought into contact with the circuit substrate and to thereby monitor ESD exposure of the circuit substrate.

CITATION LIST

Patent Literature

[PTL 1] JP 10-12691 A
[PTL 2] JP 2009-515171 A

SUMMARY

Technical Problem

While, with the above-described related art, it is possible to detect that static electricity discharge occurs at an object, it is not possible to judge whether the static electricity discharge affects the object to a level wherein the quality is affected. Therefore, there is a case where even an object whose quality is not affected is regarded as a disqualified product, which may degrade a yield accordingly.

The present invention has been made in view of the above-described problems, and an object of the present invention is to provide a method for managing assembling process of an electrical product which is capable of identifying and managing an electrical product affected by static electricity discharge with high accuracy.

Solution to Problem

To achieve the above-described object, an embodiment of the present invention is a method for managing an assembling process of an electrical product including at least a substrate on which a semiconductor component is mounted and a power supply circuit, the method including always measuring a potential difference between two points on electrical lines or signal lines electrically connected across an impedance element inside the electrical product while the electrical product is assembled, and recording measurement data of the potential difference between the two points when change exceeding a predetermined threshold for distinguishing between static electricity discharge noise and a normal potential range occurs in the potential difference between the two points, and providing a marker for identifying that the electrical product is affected by static electricity discharge to the electrical product.

Advantageous Effects of Invention

According to the embodiment of the present invention, by always measuring a potential difference between two points on electrical lines or signal lines electrically connected across an impedance element inside an electrical product and monitoring whether or not change exceeding a predetermined threshold occurs in the potential difference between the two points while the electrical product is assembled, it is possible to identify and manage an electrical product affected by static electricity discharge with high accuracy.

DESCRIPTION OF EMBODIMENTS

Figure 1:
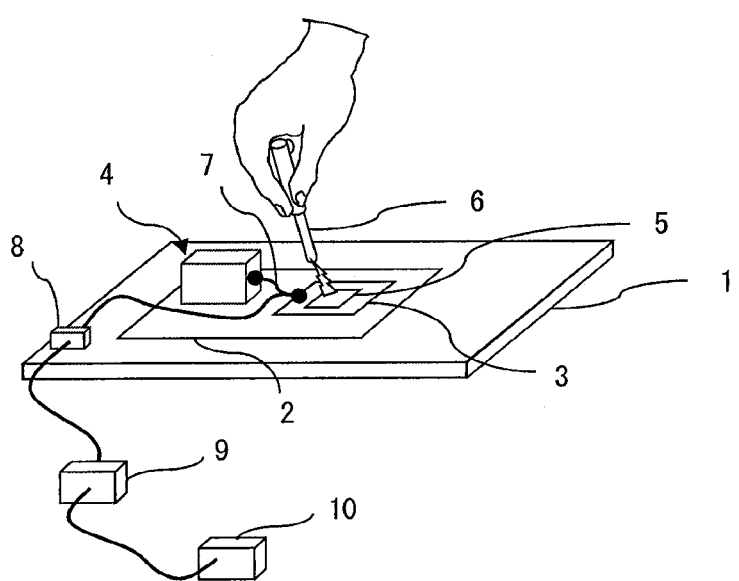
FIG. 1 is a diagram for explaining an apparatus configuration according to Embodiment 1 of the present invention.

Embodiments of the present invention will be described in detail below with reference to the drawings. It should be noted that the same reference numerals are assigned to elements common in the drawings, and explanation thereof will be omitted.

Embodiment 1

FIG. 1 is a diagram for explaining an apparatus configuration according to Embodiment 1 of the present invention.

An apparatus illustrated in FIG. 1 includes a workbench 1. An electrical product 2 is placed on the workbench 1. The electrical product 2 includes at least a substrate 3 and a power supply circuit 4. A semiconductor component (a semiconductor device) 5 is mounted on the substrate 3. The substrate 3 and the power supply circuit 4 are mounted on the electrical product 2 using a tool 6.

The semiconductor component 5 is electrically connected to the power supply circuit 4 using electrical lines 7 via the substrate 3. Further, the electrical lines 7 are connected to static electricity measuring equipment 9 via a terminal 8. The static electricity measuring equipment 9 is connected to a computer 10.

While the electrical product 2 is assembled, the static electricity measuring equipment 9 always measures a potential difference between two points on the electrical lines 7 electrically connected across an impedance element (semiconductor component 5) inside the electrical product 2. It should be noted that a measurement period is preferably equal to or less than 100 ns.

Further, when change exceeding a predetermined threshold for distinguishing between static electricity discharge noise and a normal potential range occurs in the above-described potential difference between the two points, the static electricity measuring equipment 9 transmits measurement data of the above-described potential difference between the two points to the computer 10. It should be noted that the above-described threshold is an index indicating static electricity discharge which can affect quality, and is set in advance based on an experimental result or a simulation result. As one example, when a rated voltage of the semiconductor component is 5.5 V, the threshold is set at 7 V.

The computer 10 includes a memory including, for example, a ROM, a RAM, or the like, an input/output interface for inputting/outputting various kinds of information, and a processor which is capable of executing various kinds of arithmetic processing based on the various kinds of information. The computer 10 receives and records the measurement data transmitted from the static electricity measuring equipment 9 and provides a marker for identifying that the electrical product 2 is affected by static electricity discharge to the electrical product 2. Specifically, the computer 10 adds a marker to the measurement data. The computer 10 has a screen as an output interface and displays the measurement data to which the marker is added on the screen. Further, the computer 10 has a communication connector for connecting to external equipment as an output interface and externally transmits the measurement data via the communication connector.

Figure 2:
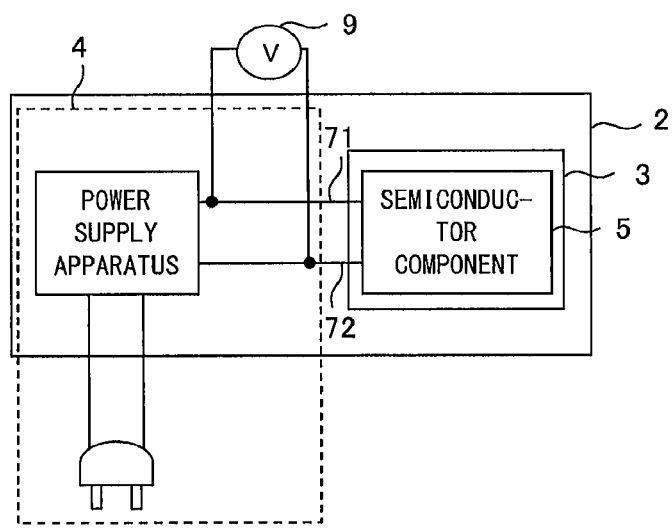
FIG. 2 is a diagram for explaining electrical connection between a semiconductor component 5 and static electricity measuring equipment 9 in Embodiment 1.

FIG. 2 is a diagram for explaining electrical connection between the semiconductor component 5 and the static electricity measuring equipment 9 in Embodiment 1. The electrical lines 7 illustrated in FIG. 1 includes two electrical lines 71 and 72 illustrated in FIG. 2. The two electrical lines 71 and 72 connect the power supply circuit 4 (power supply apparatus in FIG. 2) and the semiconductor component 5. The static electricity measuring equipment 9 is connected to one point on the electrical line 71 and one point on the electrical line 72. The static electricity measuring equipment 9 measures a potential difference between the two electrical lines 71 and 72.

(Flowchart)

Figure 3:
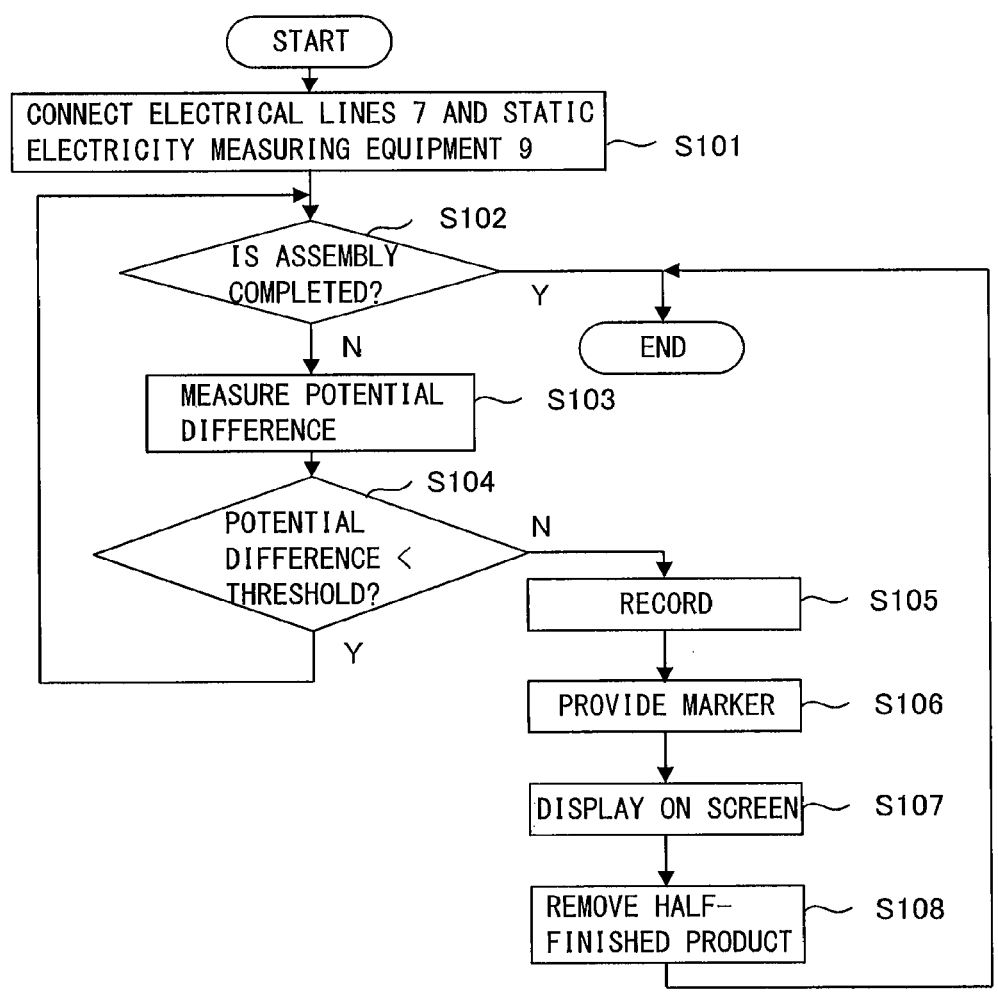
FIG. 3 is a flowchart for explaining a method for managing an assembling process of an electrical product 2 in Embodiment 1.

FIG. 3 is a flowchart for explaining a method for managing an assembling process of the electrical product 2 in Embodiment 1. Routine illustrated in FIG. 3 is executed every time assembly of the electrical product 2 is started.

In step S101, a worker connects the electrical lines 7 and the static electricity measuring equipment 9. Specifically, the worker connects the two electrical lines 71 and 72 to the static electricity measuring equipment 9. It should be noted that the worker is not limited to a human and may be mechanical equipment having a robot arm, or the like.

In step S102, the worker determines whether or not an assembling process of the electrical product 2 is completed. When the assembling process is not completed, processing in step S103 is executed.

In step S103, the static electricity measuring equipment 9 measures a potential difference between the two electrical lines 71 and 72.

In step S104, the static electricity measuring equipment 9 determines whether or not the potential difference measured in step S103 is smaller than a threshold. As described above, the threshold is a predetermined value for distinguishing between static electricity discharge noise and a normal potential range and is set in advance.

When the determination conditions in step S104 are satisfied, static electricity discharge which affects quality of the electrical product 2 does not occur, and processing from step S102 is continued. When it is determined in step S102 that the assembling process of the electrical product 2 is completed, this routine is finished.

When the determination conditions in step S104 are not satisfied, the measurement data of the potential difference measured in step S103 is recorded in the computer 10 (step S105). Specifically, the static electricity measuring equipment 9 transmits the measurement data to the computer 10, and the computer 10 stores the received measurement data.

In step S106, the computer 10 provides a marker to the measurement data. The marker is a marker for identifying that the electrical product 2 is affected by static electricity discharge.

In step S107, the computer 10 displays the measurement data to which the marker is added, on the screen. Further, the computer 10 externally transmits the measurement data via the communication connector. Through these processing, the worker can know that static electricity discharge which can affect quality occurs at a half-finished product which is being manufactured.

In step S108, the worker removes the half-finished product at which static electricity discharge which can affect quality occurs. After the processing in step S108, this routine is finished.

As described above, according to the method for managing the assembling process of the electrical product according to Embodiment 1, by always measuring the potential difference between the two points on the electrical lines 7 electrically connected across the impedance element inside the electrical product and monitoring whether or not change exceeding the predetermined threshold occurs in the potential difference between the two points while the electrical product is assembled, it is possible to identify and manage an electrical product affected by static electricity discharge with high accuracy. Further, according to the method for managing the assembling process of the electrical product according to Embodiment 1, when static electricity discharge which can affect quality of a half-finished product which is being manufactured occurs, it is possible to immediately remove the half-finished product which is being assembled.

(Modified Example)

A modified example of the above-described Embodiment 1 will be described.

Figure 4:
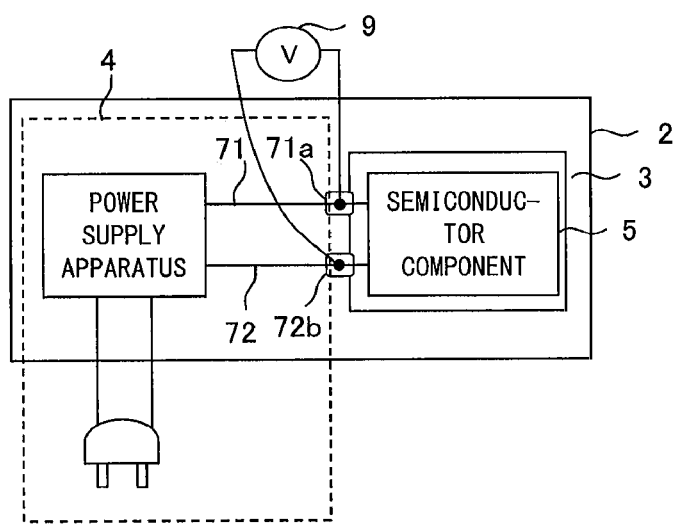
FIG. 4 is a diagram for explaining one modified example of Embodiment 1.

FIG. 4 is a diagram for explaining one modified example of Embodiment 1. The configuration in FIG. 4 is the same as the configuration in FIG. 2 except that connectors 71a and 72b are provided. The connector 71a is connected on one point on the electrical line 71, and the connector 72b is connected on one point on the electrical line 72. The static electricity measuring equipment 9 is connected to the connectors 71a and 72b. Because the connectors 71a and 72b for measuring a potential difference are provided on two points which are measurement points, attachment of the static electricity measuring equipment 9 becomes easy, which improves management efficiency of the assembling process of the electrical product 2.

Figure 5:
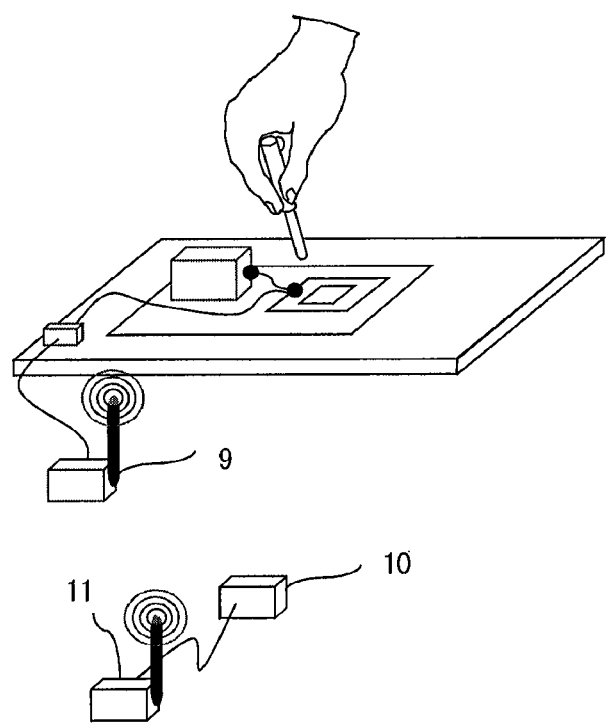
FIG. 5 is a diagram for explaining one modified example of Embodiment 1.

FIG. 5 is a diagram for explaining one modified example of Embodiment 1. The configuration in FIG. 5 is the same as the configuration in FIG. 1 except that the static electricity measuring equipment 9 has a radio communication function for transmitting measurement data, and radio communication equipment 11 is added. The radio communication equipment 11 receives the measurement data transmitted from the static electricity measuring equipment 9 and transmits the measurement data to the computer 10. In this manner, it is also possible to employ a configuration where the static electricity measuring equipment 9 is wirelessly connected to the computer 10.

Figure 11:
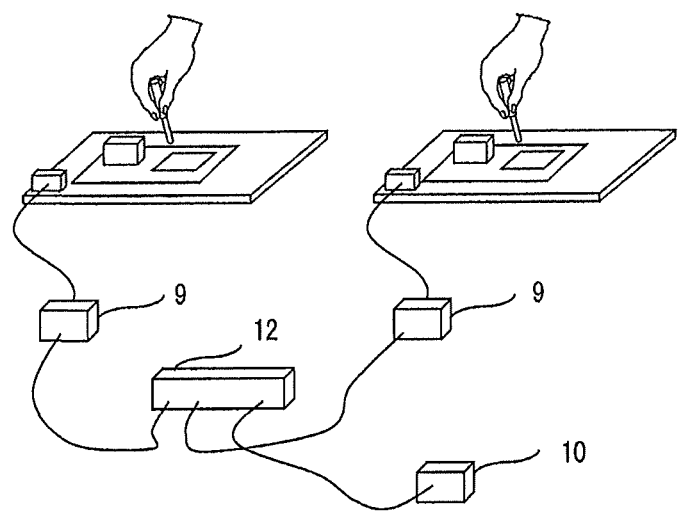
FIG. 11 is a diagram for explaining one modified example of Embodiment 1.

FIG. 11 is a diagram for explaining one modified example of Embodiment 1. In the configuration illustrated in FIG. 11, the static electricity measuring equipment 9 is provided for each workbench, and each static electricity measuring equipment 9 is connected to a common wired transmission path 12. The wired transmission path 12 is connected to the computer 10. Each static electricity measuring equipment 9 transmits the measurement data to the computer 10 via the wired transmission path 12. In this manner, it is also possible to employ a configuration where a plurality of static electricity measuring equipment 9 are connected in a wired manner to one computer 10. This point will also apply to the following embodiments.

Figure 12:
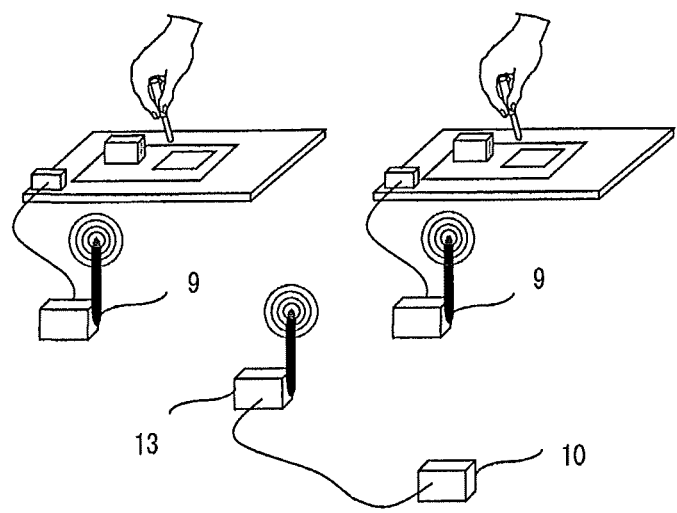
FIG. 12 is a diagram for explaining one modified example of Embodiment 1.

FIG. 12 is a diagram for explaining one modified example of Embodiment 1. In the configuration illustrated in FIG. 12, the static electricity measuring equipment 9 is provided for each workbench, and each piece of static electricity measuring equipment 9 has a radio communication function. Radio communication equipment 13 receives the measurement data transmitted from each piece of static electricity measuring equipment 9 and transmits the measurement data to the computer 10. In this manner, it is also possible to employ a configuration where multiple pieces of static electricity measuring equipment 9 are wirelessly connected to one computer 10. This point will also apply to the following embodiments.

Embodiment 2

Embodiment 2 of the present invention will be described next with reference to FIG. 6 to FIG. 9.

In the above-described Embodiment 1, in order to measure the potential difference between the two points on the electrical lines electrically connected across the impedance element (semiconductor component), a potential difference between two points of the power supply circuit 4 and the semiconductor component 5 on the electrical lines 7 is measured. However, the points where the potential difference is measured are not limited to these. In Embodiment 2, a potential difference between terminals of a plug of the power supply circuit 4 is measured.

Figure 6:
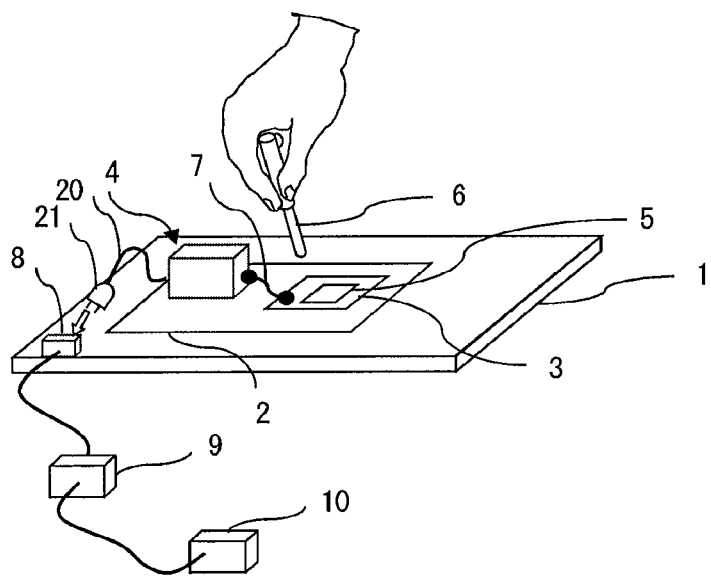
FIG. 6 is a diagram for explaining an apparatus configuration according to Embodiment 2 of the present invention.

FIG. 6 is a diagram for explaining an apparatus configuration according to Embodiment 2 of the present invention.

An apparatus illustrated in FIG. 6 includes the workbench 1. The electrical product 2 is placed on the workbench 1. The electrical product 2 includes at least the substrate 3 and the power supply circuit 4. The semiconductor component 5 is mounted on the substrate 3. The substrate 3 and the power supply circuit 4 are mounted on the electrical product 2 using the tool 6.

The power supply circuit 4 and the semiconductor component 5 are electrically connected using the electrical lines 7 via the substrate 3. Further, the electrical lines 7 are electrically connected to electrical lines 20 inside the power supply circuit 4. The electrical lines 20 have a plug 21. The plug 21 is connected to a terminal 8. Therefore, the electrical lines 20 are connected to the static electricity measuring equipment 9 via the terminal 8. The static electricity measuring equipment 9 is connected to the computer 10.

The static electricity measuring equipment 9 always measures a potential difference between two points on the electrical lines 20 electrically connected across the impedance element (semiconductor component 5) inside the electrical product 2 while the electrical product 2 is assembled. It should be noted that a measurement period is preferably equal to or less than 100 ns.

Further, when change exceeding a predetermined threshold for distinguishing between static electricity discharge noise and a normal potential range occurs in the above-described potential difference between the two points, the static electricity measuring equipment 9 transmits measurement data of the above-described potential difference between the two points to the computer 10. It should be noted that the above-described threshold is an index indicating static electricity discharge which can affect quality and is set in advance based on an experimental result or a simulation result.

Since the computer 10 is as described in Embodiment 1, description thereof will be omitted.

Figure 7:
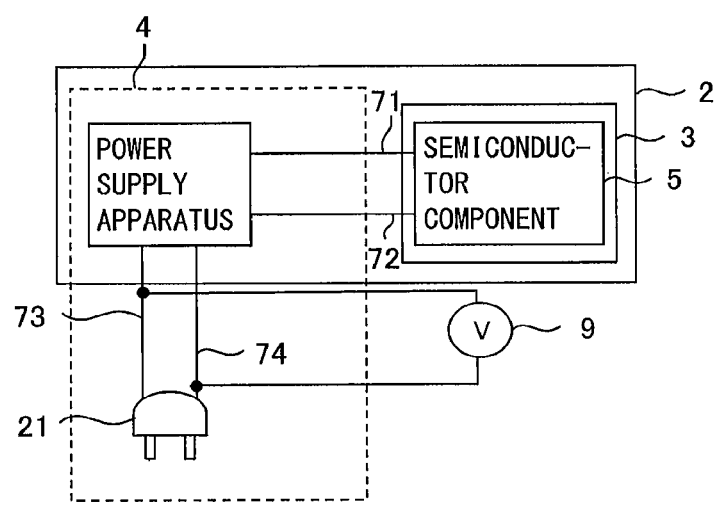
FIG. 7 is a diagram for explaining electrical connection between the semiconductor component 5 and the static electricity measuring equipment 9 in Embodiment 2.

FIG. 7 is a diagram for explaining electrical connection between the semiconductor component 5 and the static electricity measuring equipment 9 in Embodiment 2. The electrical lines 20 illustrated in FIG. 6 includes two electrical lines 73 and 74 illustrated in FIG. 7. The two electrical lines 73 and 74 connect the power supply circuit 4 and the plug 21. The static electricity measuring equipment 9 is connected to one point on the electrical line 73 and one point on the electrical line 74. The static electricity measuring equipment 9 measures a potential difference between the two electrical lines 73 and 74.

(Flowchart)

Figure 8:
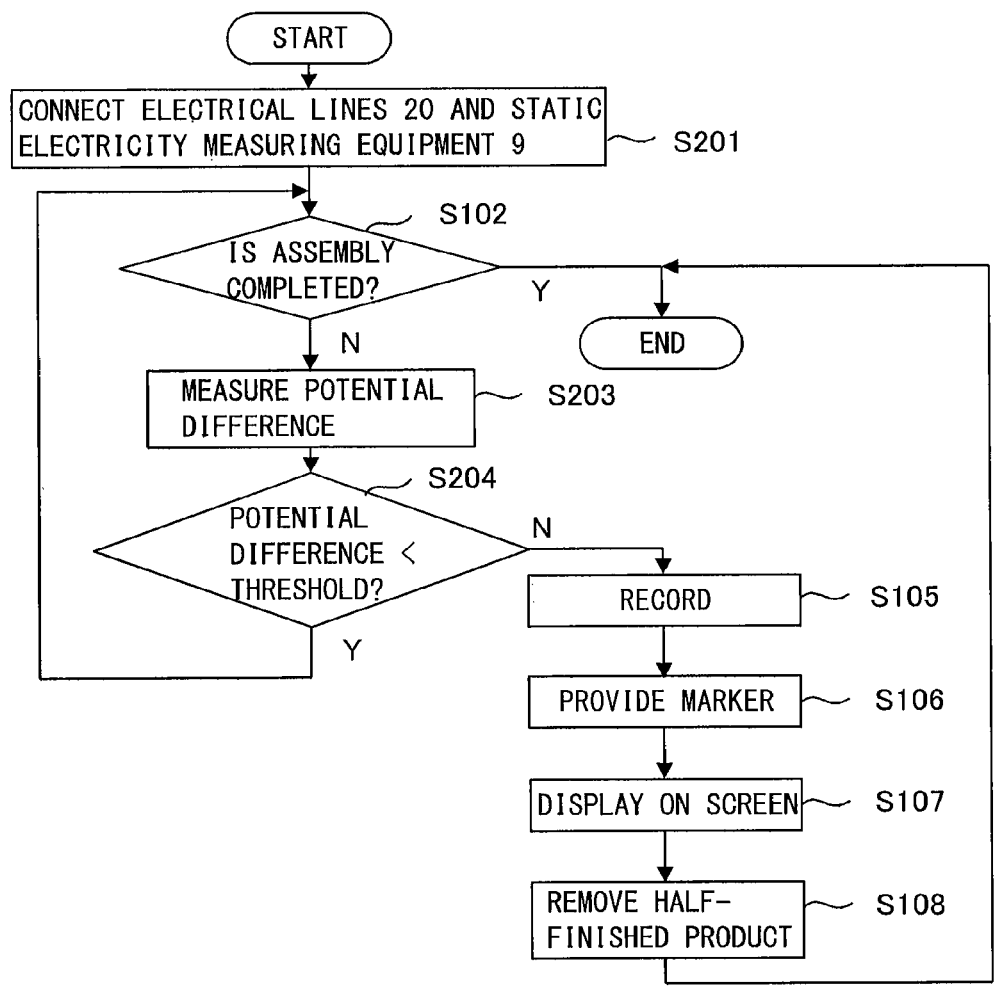
FIG. 8 is a flowchart for explaining a method for managing an assembling process of the electrical product 2 in Embodiment 2.

FIG. 8 is a flowchart for explaining a method for managing assembling process of the electrical product 2 in Embodiment 2. Routine illustrated in FIG. 8 is executed every time the electrical product 2 is assembled. This routine is the same as the routine illustrated in FIG. 3 except that step S101 is replaced with step S201, step S103 is replaced with step S203, and step S104 is replaced with step S204. In the following description, in FIG. 8, the same reference numerals will be assigned to the same steps as the steps illustrated in FIG. 3.

In step S201, the worker connects the electrical lines 20 and the static electricity measuring equipment 9. Specifically, the worker connects the two electrical lines 73 and 74 to the static electricity measuring equipment 9. It should be noted that the worker is not limited to a human, and may be mechanical equipment having a robot arm, or the like.

In step S102, the worker determines whether or not assembling process of the electrical product 2 is completed. When the assembling process is not completed, the processing in step S203 is executed.

In step S203, the static electricity measuring equipment 9 measures a potential difference between the two electrical lines 73 and 74.

In step S204, the static electricity measuring equipment 9 determines whether or not the potential difference measured in step S203 is smaller than a threshold. The threshold is a predetermined value for distinguishing between static electricity discharge noise and a normal potential range and is set in advance.

When the determination conditions in step S204 are satisfied, static electricity discharge which affects quality of the electrical product 2 does not occur, and the processing from step S102 is continued. When it is determined in step S102 that the assembling process of the electrical product 2 is completed, this routine is finished.

When the determination conditions in step S204 are not satisfied, the measurement data of the potential difference measured in step S203 is recorded (step S105). Specifically, the static electricity measuring equipment 9 transmits the measurement data to the computer 10, and the computer 10 stores the received measurement data.

In step S106, the computer 10 provides a marker to the measurement data. The marker is a marker for identifying that the electrical product 2 is affected by static electricity discharge.

In step S107, the computer 10 displays the measurement data to which the marker is provided, on the screen. Further, the computer 10 externally transmits the measurement data via the communication connector. Through the processing, the worker can know that static electricity discharge which can affect quality occurs at a half-finished product which is being manufactured.

In step S108, the worker removes a half-finished product at which static electricity discharge which can affect quality occurs. After the processing in step S108, this routine is finished.

As described above, according to the method for managing the assembling process of the electrical product according to Embodiment 2, by always measuring the potential difference between the two points on the electrical lines 20 electrically connected across the impedance element inside the electrical product and monitoring whether or not change exceeding the predetermined threshold occurs in the potential difference between the two points while the electrical product is assembled, it is possible to identify and manage an electrical product affected by static electricity discharge with high accuracy. Further, according to the method for managing the assembling process of the electrical product according to Embodiment 2, when static electricity discharge which can affect quality occurs at a half-finished product which is being manufactured, it is possible to immediately remove the half-finished product which is being assembled.

(Modified Example)

Figure 9:
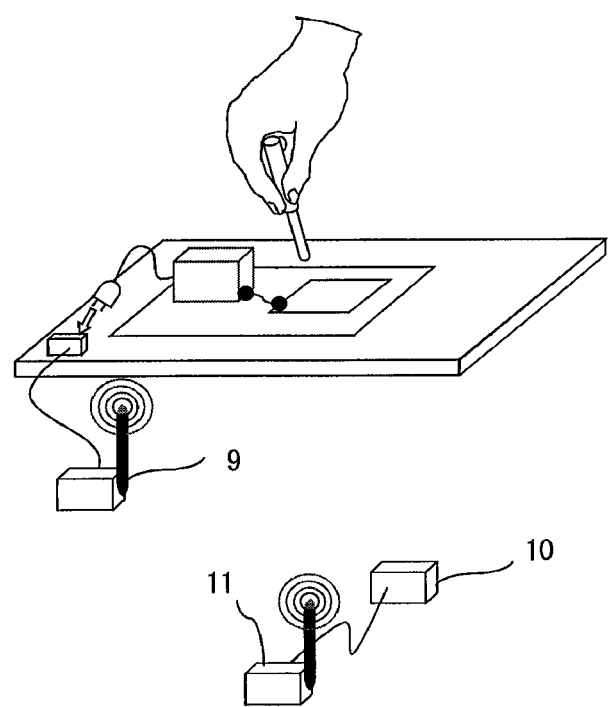
FIG. 9 is a diagram for explaining one modified example of Embodiment 2.

A modified example of the above-described Embodiment 2 will be described. FIG. 9 is a diagram for explaining one modified example of Embodiment 2. The configuration in FIG. 9 is the same as the configuration in FIG. 6 except that the static electricity measuring equipment 9 has a radio communication function for transmitting measurement data, and the radio communication equipment 11 is added. The radio communication equipment 11 receives the measurement data transmitted from the static electricity measuring equipment 9 and transmits the measurement data to the computer 10. In this manner, it is also possible to employ a configuration where the static electricity measuring equipment 9 and the computer 10 are wirelessly connected.

Embodiment 3

Embodiment 3 of the present invention will be described next with reference to FIG. 10. In Embodiments 1 and 2, the potential difference between the two points on the electrical lines is measured. However, it is also possible to measure a potential difference between two points on signal lines by utilizing connectors for signal test provided on the signal lines.

Figure 10:
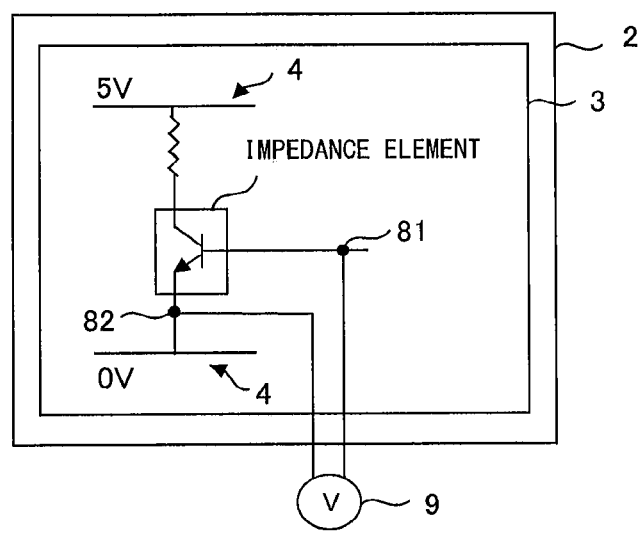
FIG. 10 is a diagram for explaining an example where a potential difference between two points on signal lines is measured in Embodiment 3.

FIG. 10 is a diagram for explaining an example where a potential difference between two points on signal lines is measured in Embodiment 3. The electrical product 2 includes the substrate 3 and a power supply circuit. On the substrate 3, an impedance element such as a semiconductor component and a memory is disposed. The static electricity measuring equipment 9 is connected to connectors 81 and 82 for signal test provided on the signal lines. The static electricity measuring equipment 9 always measures a potential difference between two points (connectors 81 and 82 for signal test) on the signal lines across the impedance element while the electrical product 2 is assembled. When change exceeding a predetermined threshold for distinguishing between static electricity discharge noise and a normal potential range occurs in the above-described potential difference between the two points, the static electricity measuring equipment 9 transmits measurement data of the above-described potential difference between the two points to the computer 10. It should be noted that the above-described threshold is an index indicating static electricity discharge which can affect quality and is set in advance based on an experimental result or a simulation result. Because the computer 10 is as described in the above-described Embodiment 1, detailed explanation thereof will be omitted. The computer 10 records the measurement data transmitted from the static electricity measuring equipment 9 and provides a marker for identifying that the electrical product 2 is affected by static electricity discharge to the electrical product 2.

REFERENCE SIGNS LIST

1 Workbench
2 Electrical product
3 Substrate
4 Power supply circuit
5 Semiconductor component
6 Tool
7 Electrical lines
8 Terminal
9 Static electricity measuring equipment
10 Computer
11, 13 Radio communication equipment
12 Wired transmission path
20 Electrical lines
21 Plug
71, 72, 73, 74 Electrical line
71a, 72b Connector
81, 82 Connector for signal test

The invention claimed is:

1. A method for managing an assembling process of an electrical product, the electrical product including a power supply circuit and a substrate on which a semiconductor component is mounted, wherein the power supply circuit supplies a potential across the semiconductor component, the method comprising:

electrically connecting two lines of a static electricity measuring equipment to two points on electrical lines or signal lines electrically connected across the semiconductor component;

continuously measuring a potential difference between the two points on the electrical lines or the signal lines electrically connected across the semiconductor component inside the electrical product throughout the assembling process of the electrical product; and when a change in the potential difference measured between the two points on the electrical lines or the signal lines exceeds a predetermined threshold for distinguishing between static electricity discharge noise and a normal potential range occurs during the assembling process of the electrical product, measurement data of the potential difference between the two points is recorded in a computer in communication with the static electricity measuring equipment and a marker is provided in the measurement data of the potential difference between the two points for identifying that the electrical product is affected by static electricity discharge to the electrical product.

2. The method for managing the assembling process of the electrical product according to claim 1, wherein, as the potential difference between the two points, a potential difference between two electrical lines which connect the power supply circuit and the semiconductor component is measured.

3. The method for managing the assembling process of the electrical product according to claim 1, wherein connectors for measuring the potential difference are prepared in advance at the two points on the electrical lines or the signal lines which are measurement points.

4. The method for managing the assembling process of the electrical product according to claim 1, wherein the potential difference between the two points on the signal lines is measured by utilizing connectors for a signal test provided on the signal lines.

5. The method for managing the assembling process of the electrical product according to claim 1, wherein, as the potential difference between the two points, a potential difference between terminals of a plug of the power supply circuit is measured.

6. The method for managing the assembling process of the electrical product according to claim 1, wherein the potential difference between the two points is measured at a measurement period of equal to or less than 100 ns.

7. The method for managing the assembling process of the electrical product according to claim 1, wherein the static electricity measuring equipment which measures the potential difference between the two points is wirelessly connected to the computer which records measurement data of the potential difference between the two points.

\* \* \* \* \*